USO05096562A

United States Patent [19]
Boozenny et al.

[11] Patent Number: 5,096,562
[45] Date of Patent: Mar. 17, 1992

[54] ROTATING CYLINDRICAL MAGNETRON STRUCTURE FOR LARGE AREA COATING

[75] Inventors: Alex Boozenny, Walnut Creek; Josef T. Hoog, Novato, both of Calif.

[73] Assignee: The BOC Group, Inc., New Providence, N.J.

[21] Appl. No.: 609,815

[22] Filed: Nov. 6, 1990

Related U.S. Application Data

[63] Continuation-in-part of Ser. No. 433,653, Nov. 8, 1989, abandoned.

[51] Int. Cl.$^5$ ............................................. C23C 14/35
[52] U.S. Cl. .......................... 204/298.22; 204/298.09
[58] Field of Search .................. 204/298.09, 298.21, 204/298.22, 298.12

[56] References Cited

U.S. PATENT DOCUMENTS

| | | | |
|---|---|---|---|
| 3,718,572 | 2/1973 | Robison et al. | 204/298.09 |
| 4,356,073 | 10/1982 | McKelvey | 204/192.12 |
| 4,417,968 | 11/1983 | McKelvey | 204/192.12 |
| 4,422,916 | 12/1983 | McKelvey | 204/192.12 |
| 4,443,318 | 4/1984 | McKelvey | 204/298.23 |
| 4,445,997 | 5/1984 | McKelvey | 204/298.23 |
| 4,466,877 | 8/1984 | McKelvey | 204/298.23 |

FOREIGN PATENT DOCUMENTS 3229969 4/1983 Fed. Rep. of Germany ....................... 204/298.27

OTHER PUBLICATIONS

M. Wright et al., *J. Vac. Sci. Technol.*, A4, No. 3, May/-Jun. 1986, pp. 388-392.
Shatterproof Glass Corp., "Architectural Dept. Rotatable Magnetron II Assembly", Sep. 26, 1985.

*Primary Examiner*—Aaron Weisstuch
*Attorney, Agent, or Firm*—David A. Draegert; Robert I. Pearlman

[57] ABSTRACT

Mechanisms for supporting, rotating, cooling and energizing a cylindrical target structure in a magnetron through supports at each end of the target structure. Two specific configurations are described. Particular arrangements of magnets are provided within the target cylinder. Two adjacent rotating target cylinders may optionally be employed in order to increase the rate of depositing sputtered material on a substrate. The various features of this invention are particularly adapted for a large-scale cylindrical magnetron used for sputtering coatings on architectural glass panels, automobile windshields and the like, but are also advantageous for use in coating very small substrates.

10 Claims, 5 Drawing Sheets

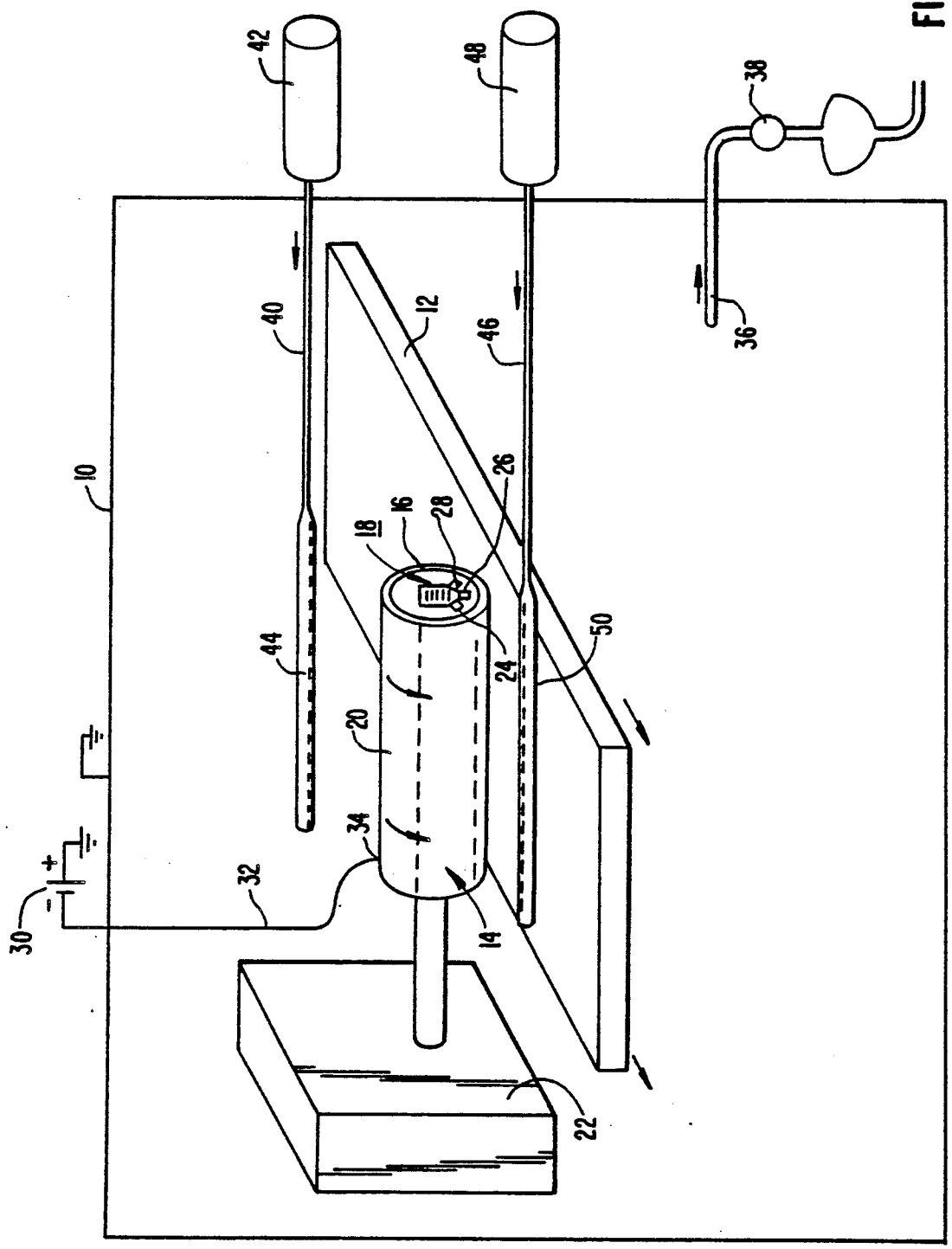
FIG_1.

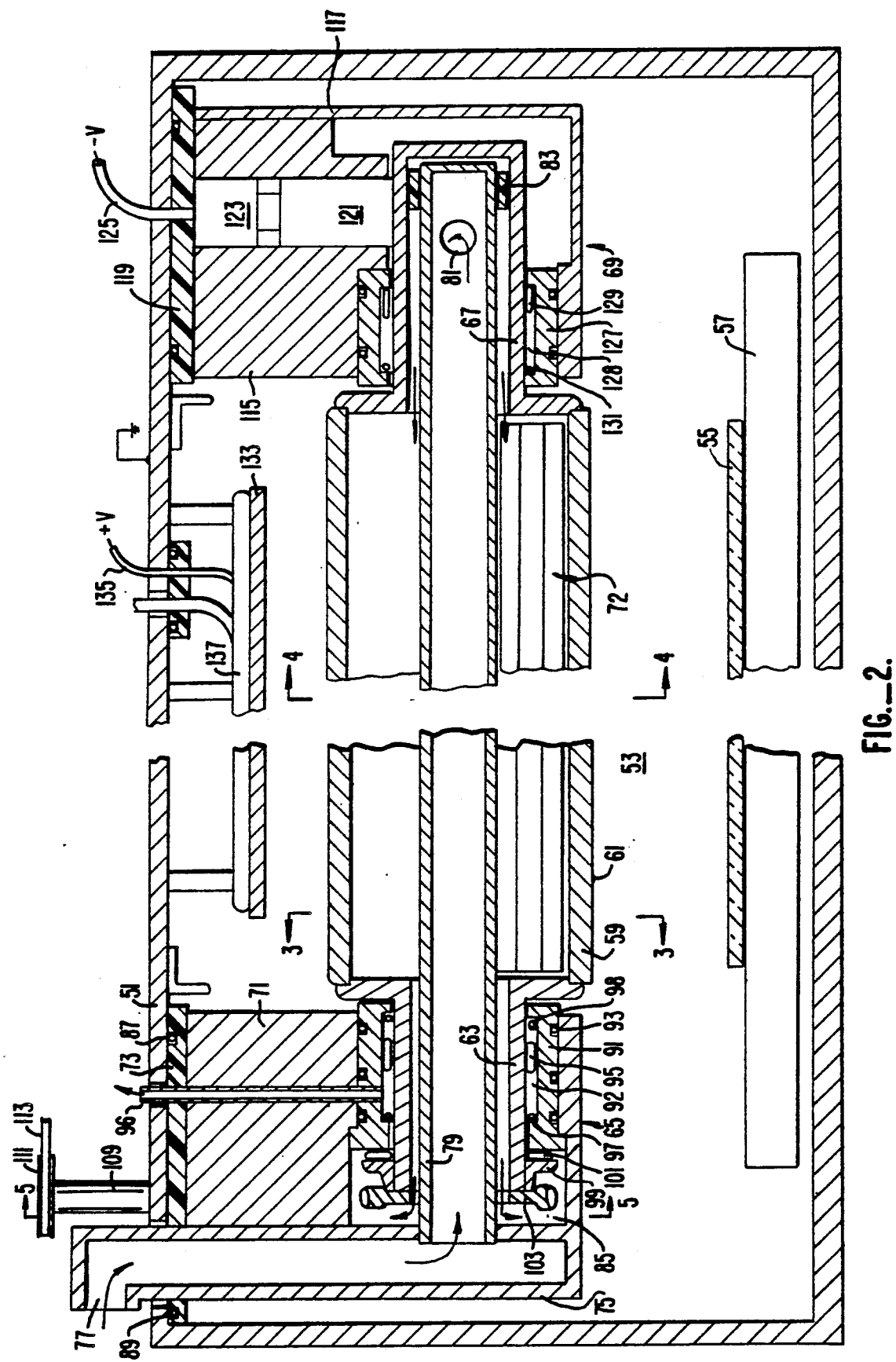
FIG._2.

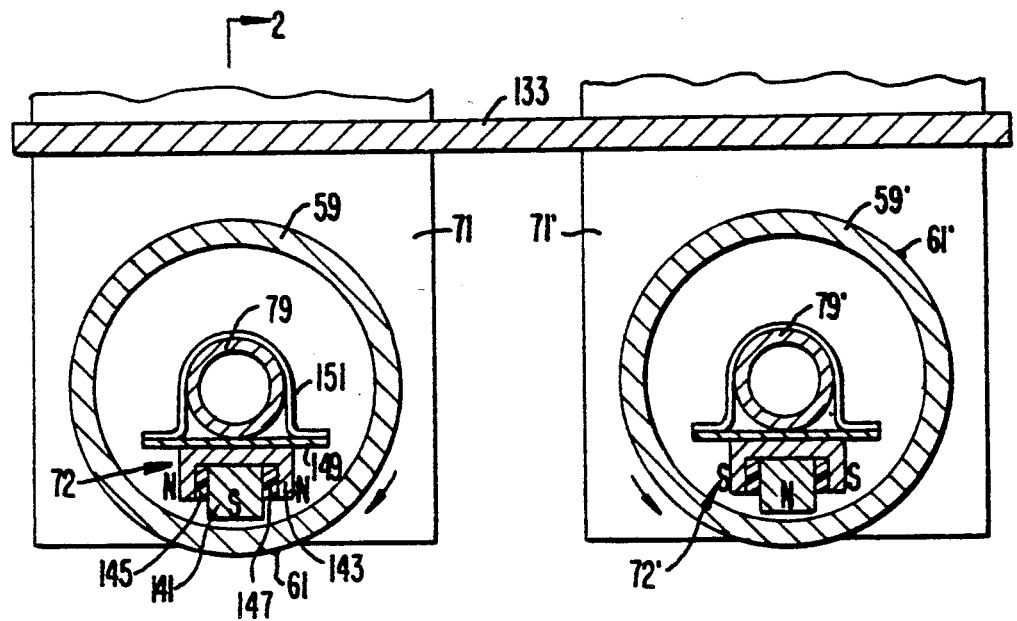
FIG._3.
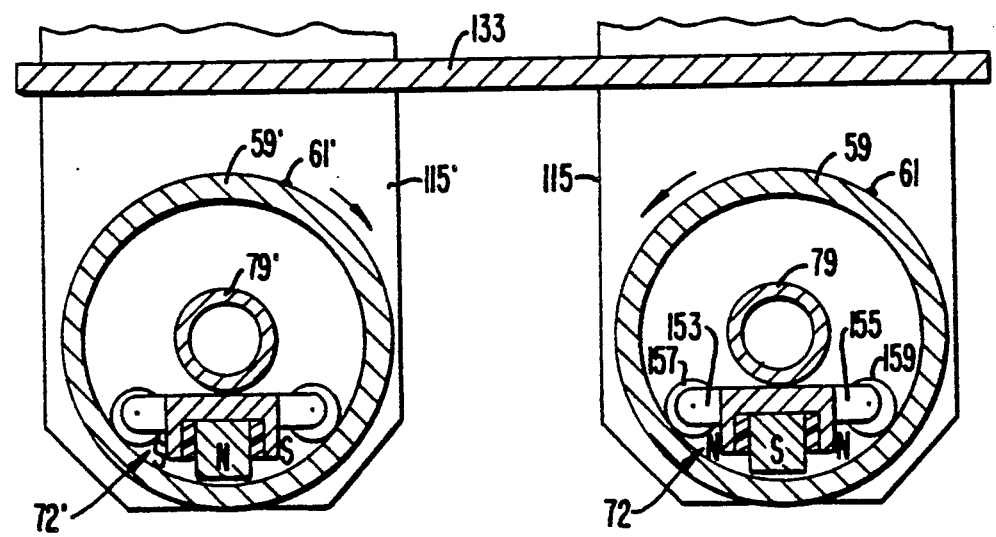
FIG._4.

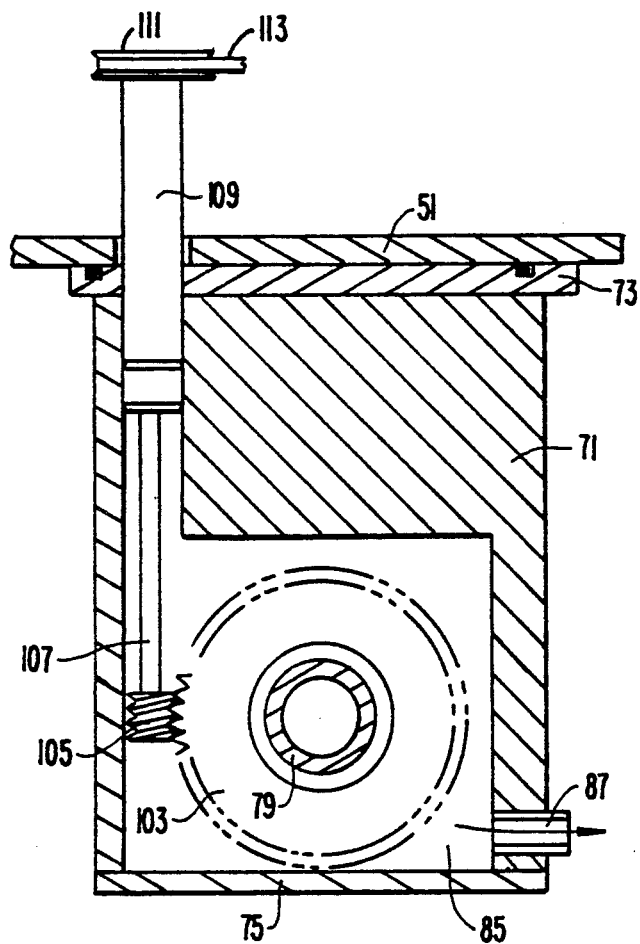
FIG._5.
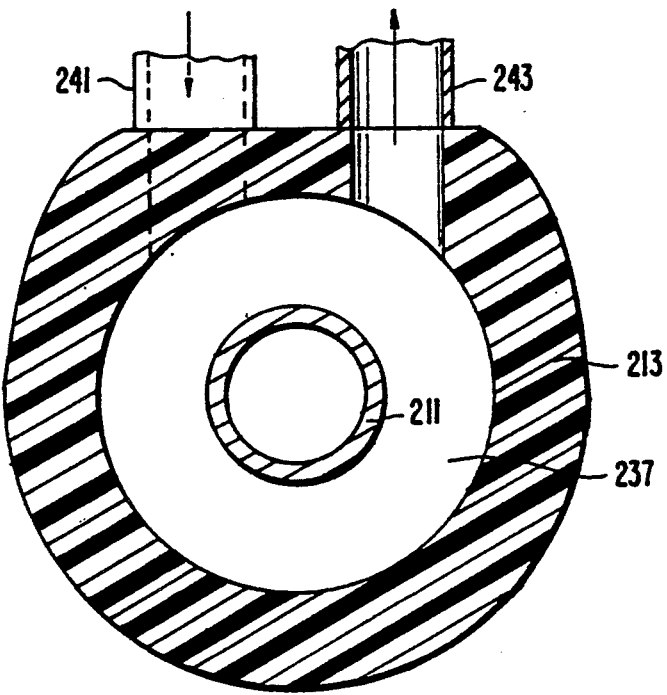
FIG._7.

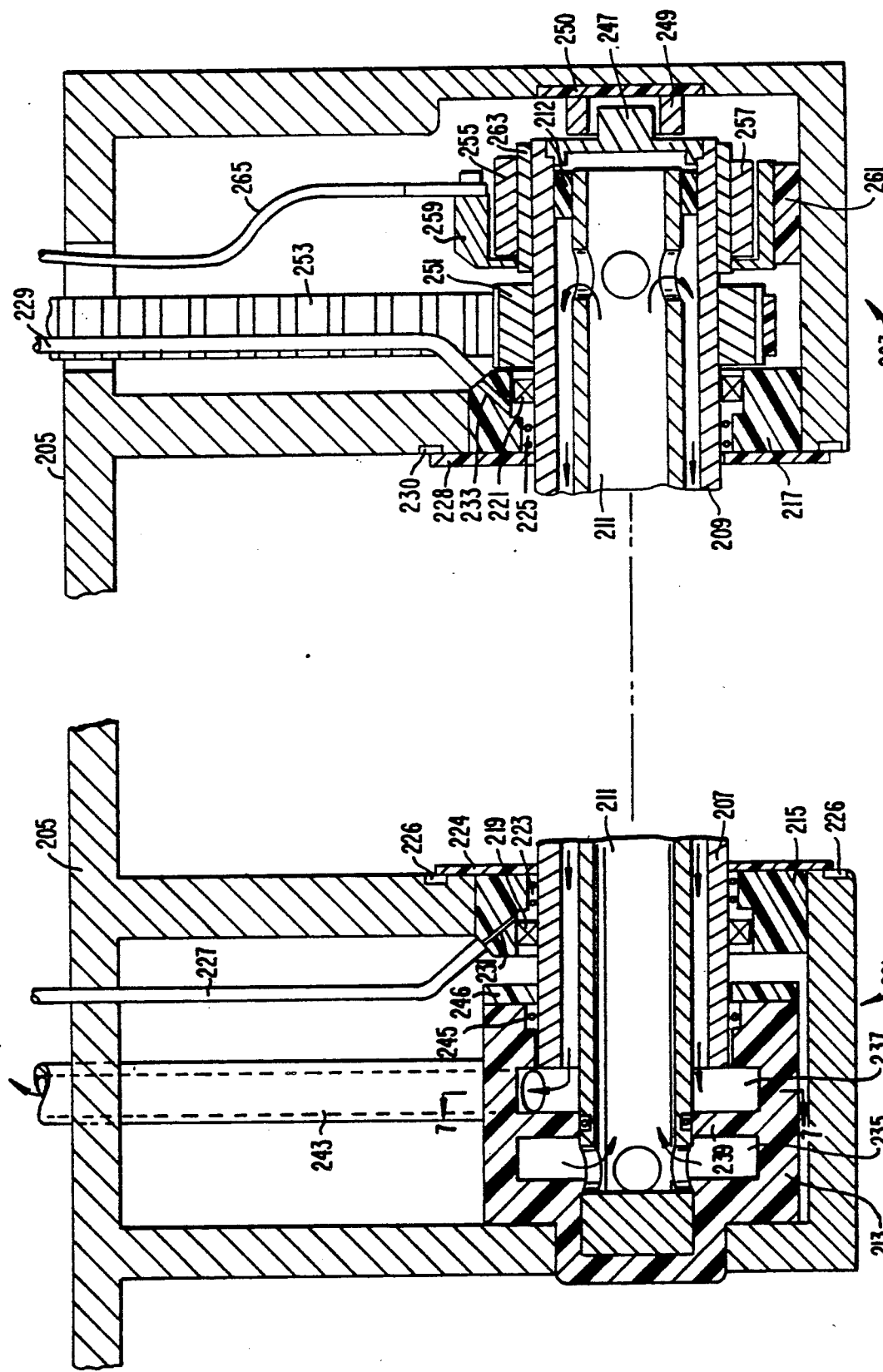
FIG._6.

ROTATING CYLINDRICAL MAGNETRON STRUCTURE FOR LARGE AREA COATING

CROSS-REFERENCE TO RELATED APPLICATION

This is a continuation-in-part of application Ser. No. 07/433,653, filed Nov. 8, 1989, now abandoned.

BACKGROUND OF THE INVENTION

This invention is related generally to the coating of substrate articles by sputtering, and more particularly, to improved structural features of a rotating cylindrical magnetron used for such coating operations.

The coating of large area substrates, such as architectural glass, automobile windshields and the like, has been accomplished for some time by a sputtering process that includes the use of a planar magnetron. Such coatings include multilayer solar control coatings that are widely used on commercial building windows. Because of the large surface area of the glass to be coated, the coating machinery is in a very large scale.

More recently, a rotating cylindrical magnetron has been suggested for this purpose. But the requirements to rotate a cylindrical sputtering target in a high vacuum, with water cooling, and a stationary magnetic field have not been satisfied in a way that allows such large scale devices to be built and efficiently operated.

Therefore, it is a primary object of the present invention to provide an improved rotating cylindrical magnetron structure that is capable of prolonged large-scale industrial sputtering applications.

It is also an object of the present invention to provide an improved rotating cylindrical magnetron structure for use in efficiently sputtering films on small objects as well.

It is a further object of the present invention to provide a rotating cylindrical magnetron structure especially adapted for sputtering dielectric films.

SUMMARY OF THE INVENTION

These and additional objects are accomplished by various structural techniques and features of the present invention which may be employed individually or in combination. According to one feature, a cylindrical sputtering target is supported on opposite ends, within a vacuum chamber, wherein the support assembly at one end supplies and withdraws cooling fluid from within the cylinder and contains a driving mechanism to rotate it, while the support mechanism at the other end contains the electrical power connection to the target surface. Axial thermal expansion and contraction of the cylinder is allowed by axially restraining it at only one end. Rotary seals to keep cooling fluid separated from the vacuum chamber are required at only the one end.

Another feature of the invention includes the minimizing of any conductive surfaces as part of the support structure which are at the same electrical potential as the target surface, thereby to avoid formation of dielectrics on such surfaces when sputtering dielectric films, thus reducing undesirable arcing. Any such conductive surfaces are provided with a dielectric layer over them, such as a ceramic plate or sufficient oxide coating, in order to avoid such arcing.

According to an alternative feature of the present invention, the cylindrical target support structures are electrically connected to walls of the vacuum chamber and rotatably carry one end of the cylindrical target by use of plastic parts. A plastic part in one of the support structures conveniently provides entrance and exit liquid coolant chambers coupled with liquid paths within the rotating target.

According to a further feature of the present invention, a water cooled anode is positioned over the rotating cylindrical target in a manner that its edges are removed from any such electrically conductive surfaces in order to direct the resulting plasma away from such surfaces.

Yet another feature is the stationary support of magnets within the rotating target cylinder by a combination of attachments to a non-rotating cooling fluid carrying conduit therein and the use of rollers that ride on the inside surface of the rotating cylinder to provide support against any sagging of an elongated structure having primary support only at its ends.

A further feature is the provision of a dual rotating cylindrical magnetron with adjacent cylinders having their magnets arranged so that opposite magnetic polarities are facing each other. This arrangement prevents concentrations of plasma that may be undesirable in certain circumstances.

Additional objects, advantages and features of the various aspects of the present invention will become apparent from the following detailed description of its preferred embodiments, which description should be taken in conjunction with the accompanying drawings.

BRIEF DESCRIPTION OF THE DRAWINGS

FIG. 1 is a schematic representation of a rotating cylindrical magnetron sputtering system of a type in which the present invention is advantageously utilized;

FIG. 2 shows, in a cross-sectional view through a middle of a cylindrical sputtering target of a type used in the system of Figure a first embodiment of a structure that includes various features of the present invention;

FIG. 3 is a cross-sectional view of the assembly of FIG. 2, taken at section 3—3 thereof;

FIG. 4 is a cross-sectional view of the assembly of FIG. 2, taken at section 4—4 thereof;

FIG. 5 is a cross-sectional view of the assembly of FIG. 2, taken at section 5—5 thereof;

FIG. 6 shows, in a cross-sectional view through a middle of a cylindrical sputtering target of a type used in the system of FIG. 1, a second embodiment of a structure that includes various features of the present invention; and FIG. 7 is a cross-sectional view of a part incorporated in the assembly of FIG. 6, taken at section 7—7 thereof.

DESCRIPTION OF THE PREFERRED EMBODIMENTS

Referring initially to FIG. 1, a sputtering system is generally described of a type wherein the improvements of the present invention are utilized. A plasma is formed within an enclosed reaction chamber 10, in which a vacuum is maintained, for the purpose of depositing a thin film of material on a substrate 12 as it moves through the chamber 10. The substrate 12 can be most anything that will accept the film to be deposited on it, and is usually some vacuum compatible material, such as metal, glass, and some plastics. The film can also be deposited over other films or coatings that have previously been formed on a substrate surface.

A cathode assembly 14 comprises generally an elongated rotatable cylindrical tube 16, mounted in the reaction chamber 10, and having a target surface 20. An elongated magnet assembly 18 is carried within a lower portion of the tube 16 and does not rotate with it. The inside of the tube 16 is typically water cooled, as described later, in order to allow the system to operate at high electrical power levels. The tube 16 is supported in a horizontal position and is rotated by a drive system 22 at a constant speed about its longitudinal axis.

The tube 16 may be constructed in one of many different forms, depending upon the nature and composition of the target material to be exposed on the outside cylindrical surface 20. One structure has walls made substantially entirely of solid target material. Another structure is formed of a core of suitable nonmagnetic material such as, for example, brass or stainless steel, and is of a diameter, wall thickness and length required for a particular operation to be performed. Applied to the outer surface of the core is a layer of a selected target material 20 to be deposited onto the substrate 12 being coated. In either case, the tube 16 and layer of target material 20 constitute a tubular target or sputtering source in place of a more conventional planar target.

The elongated magnet 18 comprises an assembly arranged lengthwise within the tube 16. The assembly is designed to result in three alternating magnetic poles 24, 26 and 28 around the circumference of the cylinder that are maintained at the bottom of the rotating cylindrical target 14. The arrangement illustrated in FIG. 1 is a "W" configuration of magnets, in cross-section. An alternative arrangement, described later, is a "U" shaped cross-sectional configuration. In either case, the magnets are positioned in relation to the tube 16 so that the their lines of force run from one pole, through the tube, and back through the tube in a curve to an adjacent pole. This arrangement generates what is called a "magnetic tunnel" between adjacent poles, which not only allows the sputtering rate to be increased, but also causes the target material 20 to be removed faster inside the tunnel.

A cathode potential sufficient to cause sputtering to occur is supplied to the rotating cathode 14 from a power source 30 through a power line 32 having sliding contact 34 with the tube 16 by a conventional electrical brush. The power source 30 is of a direct current type in the example being described but alternating current power sources can also be used in such structures. The enclosure of the reaction chamber 10 is conductive and electrically grounded. It serves as an anode in the sputtering process. A separate anode may be optionally employed and maintained at a small positive voltage, as described below.

In order to obtain the low pressure necessary for the coating operation to be performed, the reaction chamber 10 is provided with an outlet tube 36 communicating with a vacuum pump 38.

In order to provide the chamber 10 with the gases necessary for the coating operation, a gas supply system is included. A first gas supply tube 40 extends into the coating chamber 10 from a source 42 of an inert gas. Nozzles 44 connected to inlet tube 40 distribute the inert gas in a region above the rotating cathode 14. It is the inert gas that breaks down into electrically charged ions under the influence of an electric field established between the target surface 20 and the grounded chamber enclosure 10. The positive ions are attracted to and bombard the target surface 20 in an area to which they are confined by the magnetic field, primarily in two parallel strips, one between each of the opposing magnetic poles, along the length of the cylinder 16 at its bottom, opposite the magnet assembly 18.

A second gas supply tube 46 extends into the chamber 10 from a reactive gas source 48. Nozzles 50 connected to inlet tube 46 distribute the reactant gas in a region close to and across the width of the substrate 12 being coated. Molecules of the reactive gas combine with molecules sputtered from the target surface, as a result of ion bombardment, to form the desired molecules that are deposited on the top surface of the substrate 12.

Many variations in the gas supply system shown are practical as well. The inert and reactive gases from the sources 42 and 48 can be combined and delivered into the chamber 10 through a common tube and set of nozzles. When this is done, the delivery tube is preferably positioned along a side of the rotating target tube 16 and parallel with its longitudinal axis. Two such tubes can be used, one on each side of the target tube 16 and parallel with its longitudinal axis, each delivering the same combination of inert and reactive gases. Also, more than one reactive gas can be simultaneously supplied, depending upon the film being deposited.

Referring to FIG. 2, a cross-sectional view of a first embodiment of a rotating cylindrical target structure, and some associated elements, are shown. The assembly of FIG. 2 may be utilized in the sputtering system generally illustrated in the overall schematic representation of FIG. 1. An electrically grounded metal enclosure 51 forms a vacuum chamber 53 within it. Ambient room and pressure exist on the outside of the enclosing walls 51. A substrate 55 that is being coated, such as a sheet of glass, is advanced past the rotating cylindrical magnetron structure, in a direction perpendicular to the plane of the paper, by a plurality of supporting rollers, such as the roller 57.

A cylinder 59 includes formed as its outside surface 61 the target material desired for a particular sputtering process. For example, if a silicon based compound is desired to be formed as a film on the surface of a glass substrate 55, the cylindrical surface is made of silicon with a small percentage of impurities in order to make the surface electrically conductive. An aluminum concentration of 2% has been found satisfactory for a silicon target. Other popular target materials used in various glass coating applications include zinc and titanium. Generally, any target material that is being used in planar magnetrons can be used with the rotating cathode being described.

Alternate techniques of forming the target surface 61 include casting the entire tube 59 from the target material, or by coating a supporting tube of a suitable nonmagnetic material, such as brass, with an outside layer of target material through plasma spraying, liquid spraying, or the like. It is highly desirable that the bond of the target material with the cylinder surface be a good one, in order to make good thermal contact with the supporting cylinder and be adequately cooled by water circulating within the cylinder 59. Adequate cooling allows the structure to be operated at high power levels, with a resultant high rate of deposition of film material on the substrate.

The cylinder 59 includes an attached spindle shaft 63 of a smaller diameter at one end that is supported by a first support assembly 65. Similarly, an opposite end of the cylinder 59 is supported by a similar reduced diameter spindle shaft 67 that is carried by a second support assembly 69. The support assemblies 65 and 69 together hold the cylindrical target 59 in a desired rotatable position, rotate it about its longitudinal central axis, provide a source of cooling fluid and exhaust the warm fluid from it, and provide an electrical connection of it to a large d.c. voltage. All of these functions are provided by the support assemblies 65 and 69 while maintaining proper seals and interconnection between vacuum and cooling fluid under pressure, that fluid most commonly being ordinary water. The demands on the supporting structure 65 and 69 are many, particularly in scaled-up industrial applications where they need to support a cylinder 59 that is ten or more feet in length. This length is required to provide a wide target surface under which a substrate 55, such as an office building window glass pane, can pass and be coated over its entire surface width at once.

Referring initially to the first support structure 65, a metallic block 71 is attached to an underside of an upper wall of the enclosure 51 but is electrically insulated from it by a plastic member 73. A conduit member 75 carries water from a source (not shown) through an opening 77. An elongated tube 79 is fixed with a wall of the conduit member 75 in a manner that its central axis is coincident with that of the rotating cylinder 59. The purpose of the tube 79 is to carry water through the cylinder 59 to its opposite end, where it is allowed to exit through an opening 81. A sleeve or roller bearing 83 surrounding the outside of the tube 79 supports it in position as the spindle shaft 67 rotates with the cylinder 59. Water escaping that end of the tube passes back through an interior passage of the cylinder 59, thereby cooling the target surface, and exists into a chamber 85 of the support assembly 65. The chamber 85 contains a liquid return conduit 87 (FIG. 5). Since conductive elements of the assembly 65 will be maintained at the large negative voltage of the target cylinder 59, the conduit member 75 is passed through an opening of the top plate of the enclosure 51 without touching the enclosure. That opening in the enclosure is sealed by appropriate o-ring seals 87 and 89 that are carried by matching grooves in the insulating plate 73.

Since the conduit structure 75 and the supporting block 71 are fixed to the outer wall structure 51 of the vacuum chamber, the spindle shaft 63 of the cylinder 59 is supported by this structure in a manner to rotate about its longitudinal axis. A cylindrical metallic seal housing 91 is attached firmly to the block 71 and the tube structure 75 and sealed thereto by a plurality of o-rings, such as o-ring 93, carried by grooves on an outer cylindrical surface of the seal housing 91. The seal must be good enough to isolate the plenum 85, carrying water under pressure, from the vacuum chamber 53.

On an inside surface of the cylindrically shaped seal housing 91 is an annular space 92. The annular space 92 carries bearings and seals. Roller bearings 95 allow the spindle shaft 63 to rotate freely with respect to the stationary seal housing 91. The annular space 92 also carries a plurality of dynamic u-cup seals, such as seals 97 and 98 positioned adjacent opposite ends of the space 92. The purpose of these dynamic seals is to isolate the water in the chamber 85, which is under pressure, from the vacuum chamber 53. As many such seals as are necessary may be provided within the space 92.

A region of the annular space 92 between seals 97 and 98 is ported to the atmosphere by a vent 96. Thus, any water that leaks through the seal 97 tends to flow out of the space 92, rather than existing in it under pressure against the opposite end seal 98. Leakage of water into the vacuum chamber 53 is thus avoided.

In addition to the usual reasons for wanting to stabilize the cylinder 59 from movement in a direction along its length, the water coolant being forced into it under pressure provides an additional need for an effective restraint. This restraint is provided by a perpendicular bearing surface on a cylindrical sleeve 99 that is carried by an outside surface of the spindle shaft 63. A gap is formed between it and an outer face of the seal housing 91 in which roller bearings 101 are contained. As axial force is applied to the cylinder 59 that tends to move it out of the support structure 65, the sleeve 99 is frictionally engaged by a surface of a gear 103. This causes the sleeve 99 to rotate with the spindle shaft 63. The bearings 101 then allow free rotation of the sleeve 99 with respect to the seal housing 91. Movement of the entire structure of the cylinder 59 under influence of the water pressure is thus limited.

The roller bearings 95 carry the entire weight of the rotating cylindrical structure and thus are preferred to be in the form of elongated cylinders, rather than balls, in order to spread out the force and avoid wearing grooves in the seal housing 91. The preferred material is polyacetal and is available under the trademark Delrin. These rollers are rotatably captured by a normal type of bearing cage made of similar material, in order to keep them spaced apart. The use of plastic, non-electrically conductive bearings and seals has an additional advantage of not being affected by electrical currents that might travel between the target cylinder 59 and the support structure 65. Such currents will tend to erode surfaces of metallic bearings and adjacent metal parts and thus limit their life and performance.

The rotating seals, such as the seal 97, are preferably in the form of a continuous ring of Nitrile brand plastic material in the cross-sectional shape of a "U" that is then filled with a vacuum grease. No springs are utilized in forming these seals. The combination of bearings and seals provides effective isolation between the cooling water under pressure and the vacuum chamber while at the same time allowing the cylinder structure to rotate freely within the support structure 65.

Power for such rotation is also provided through the support structure 65 at one end of the cylinder. As shown by FIGS. 2 and 5, a worm gear 103 is fixed to the spindle shaft 63. A worm 105 is carried by a shaft 107 that is oriented vertically and rotated within a sleeve 109 that extends upward through an oversized opening in the vacuum chamber wall 51 and terminates at a belt pulley 111. The pulley 111 carries a belt that is driven by a convenient motor source (not shown) at a constant speed.

Appropriate static o-ring seals are provided between the sleeve 109 and the surrounding block material 71 in order to isolate the water under pressure within the chamber 85 from atmosphere. Also, appropriate rotating seals are provided within the sleeve 109 (not shown) to prevent water leakage between the rotating shaft 107 and the inside of the sleeve 109. The oversized opening in the vacuum chamber wall 51 through which the sleeve 109 passes is sealed by the insulating piece 71 and its o-ring seals, as previously described.

By structuring the support assembly 65 in the way described, the second support assembly 69 at the opposite end of the cylindrical structure is made much simpler. No rotating seals are required to isolate the vacuum chamber 53 from the cooling water under pressure since the cooling water stays completely contained within the cylindrical target structure at that end. Also, because of that containment, no rotating seal need be provided to isolate the cooling water path from the ambient pressure outside of the vacuum chamber. The main function of the support structure 69, other than rotatably supporting the spindle shaft 67, is to provide an electrical connection of the cylinder 59 with an outside voltage source.

The support assembly 69 includes a block of support material 115 carried by the underside of the top wall of the vacuum chamber 51 through an electrically insulating layer 119, as in the case of the support assembly 65. An end cover plate 117 is bolted and o-ring sealed to the block 115. A channel is provided in the block 115 that includes an electrical brush 121 and a support 123. An electrical conductor 125 passes through a sealed opening of the enclosure 51 for connection to a negative voltage supply. The brush 121 is shaped to contact the rotating spindle shaft 67 in a broad area and is preferably made of copper filled graphite. Such contact is maintained by the differential pressure that results from the vacuum in the chamber 53.

The spindle shaft 67 is rotatably carried by the support structure 69 in a manner similar to that of the support structure 65. A cylindrically shaped metallic seal housing 127 is carried by a matching opening in the block 115 and is sealed to it by a series of o-ring seals. An annular space 128 is provided on the inside surface of the seal housing 127 for bearings and seals. A set of roller bearings 129 are positioned in the annular space 128. One or more u-cup rotating seals 131, of a type discussed above, are also carried within the space 128. The seals in this case are not critical so fewer of them are necessary. Their main purpose is to isolate the electrical brush assembly from the vacuum chamber 53 so that particles generated by the frictional contact of the brush 121 with the spindle shaft 67 will not interfere with the quality of the films being sputtered on substrate 55. The spindle shaft 67 is not constrained by the support assembly 69 against axial movement, as is its counterpart spindle shaft 63 at the opposite end of the target cylinder 59. Thus, thermal expansion and contraction is accommodated without any ill effects. Provision for movement as a result of temperature changes is particularly necessary where the length of the cylinder 59 is long enough to sputter on very wide substrates.

The structure being described can be utilized for sputtering with alternating current applied through the conductor 125 to the surface 61 of the cylinder 59, or direct current. Both are utilized for different applications but the direct current embodiment is usually preferred for industrial applications where deposition rate of a film on a substrate is desired to be maximized. This is the system being described herein.

In such a system, the outside walls 51 of the vacuum chamber 53 are electrically grounded. The inside surfaces of these walls can serve as the anode but it is often desirable to include a separate floating anode 133 that is connected to a slightly positive voltage source (not shown) through a conductor 135. If such an anode is utilized, it is preferably in the form of a plane that is positioned a small distance above the cylindrical target 59, as illustrated. It is also usually desirable to cool the anode when a high level of electrical power is being used. Cooling is accomplished by passing water through copper tubing 137 that is affixed to its top side. This cooling not only maintains the anode 133 at a proper temperature but also assists in generally cooling the vacuum chamber 53.

For many applications, a single rotating cylindrical target is satisfactory. However, for high deposition rate, large-scale commercial coating systems, it is often desirable to position two or more such target assemblies in tandem, close together. An arrangement of two such target assemblies is illustrated in the cross-sectional views of FIGS. 3 and 4. Each target assembly has a structure that is substantially the same as that described above with respect to FIGS. 2 and 5. In the sectional views of FIGS. 3 and 4, elements of the second target assembly are indicated by the same reference numerals corresponding elements of the first but with a prime (') added.

The sectional views of FIGS. 3 and 4 also show details of a magnetic assembly 72 that is carried within the rotating cylindrical target 59. A magnet 141 extends substantially the entire length of the target cylinder 59. The magnet 141 is supported by a rigid piece of U-shaped ferromagnetic material 143 in order to define a path for the magnetic field. Insulators 145 and 147 are positioned on opposite sides of the magnet 141 but the magnet does contact the ferrous material 143 at its top surface. The magnetic material 143 is preferably iron and the magnet 141 is preferably a ceramic VIII material. The magnet material usually comes in square cross-sectional shaped pieces of short lengths so a number of such pieces are positioned end-to-end along the length of the cylindrical target 59. Magnets of small cross-section and opposite polarity to that of the magnet 141 can optionally be attached to the bottom of the magnetic material piece 143 on opposite sides of the magnet 141. An alternative to the "U" shaped magnetic structure shown in FIGS. 3 and 4 is a "W" shaped structure that is generally represented in FIG. 1.

Because the magnetic structure 72 is so long in a commercial embodiment of the device being described, its support is not a trivial matter. For proper sputtering operation, the magnet needs to remain fixed along the bottom of the rotating target cylinder 59. It is also desirable that the magnet 141 be held as close as possible to the inside surface of the target cylinder 59. Two types of support are illustrated, both of which are desirably used at different positions along the length of the magnetic structure 72.

Referring to FIG. 3, one of these supporting mechanisms is shown. The internal water carrying water conduit 79 is supported are keyed against rotation by the support structure 65. The magnetic material 143 is attached to the conduit 79 at periodic locations along its length by a bracket made of a rigid plate 149 and a strap 151. This prevents the magnet from being rotated with the cylinder 59.

In the case of very long magnetic structures, the bracket support may not be sufficient because of sagging that occurs along the length of the magnetic structure and support tube 79. Therefore, in order to position the magnetic pole surfaces close to an inside surface of the rotating tube 59 without scraping it, roller support is preferably employed toward the middle of such a long span. This is shown in FIG. 4. There, a pair of brackets 153 and 155 are attached to the magnetic material 143 and extend horizontally from it. To each of these brackets is journaled a roller 157 and 159, respectively. These rollers then ride on the inside of the rotating target cylinder 59 for maintaining a distance between the magnet 141 and the inside of the rotating target cylinder 59.

If a single rotating cylindrical magnetron assembly is utilized in a given installation, it does not matter what relative positions of the north and south poles of the magnetic assembly 72 take. But if two or more target assemblies are utilized adjacent each other, it may be preferable to have alternating polarity orientations of adjacent units. This is illustrated in each of FIGS. 3 and 4. One of the adjacent target assemblies has its polarity arranged in a north-south-north sequence while the adjacent one has a south-north-south arrangement. The different polarity arrangements are provided by simply rotating the magnet 141 one hundred eighty degrees about their longitudinal axis. This has been found to desirably control the position and shape of the resulting plasma near the surface of the substrate 55 that is being coated, under some circumstances. Under other circumstances, the magnets may be identically arranged in each of the two adjacent targets.

Each of the support assemblies 65 and 69, in the embodiment shown, utilizes metallic elements because of their strength and workability. The support assemblies 65 and 69 are electrically connected to the same potential as the rotating target assembly, in order to eliminate arcing between adjacent metal parts. Thus, the large negative voltage of the target surface 61 also exists on these metal parts. A problem can arise in certain coating operations, depending upon the materials being coated, when significant amounts of conductive material surface areas at that voltage are exposed within the vacuum chamber 53. When a dielectric film is being deposited on the substrate 55, some amount of that film is deposited on the exposed surfaces, such as exposed surfaces of the end blocks 71 and 115. This can result in arcing which undesirably generates particulate material that interferes with the quality of the film being deposited.

Among the worst offenders is silicon dioxide, a desirable dielectric film to be deposited onto the substrate 55. In this case, the target surface 61 is primarily silicon and the reactive gas is oxygen. Because silicon dioxide is such a good insulator, it does not take a very thick deposition on such exposed high voltage surfaces to result in such arcing.

Therefore, the amount of such an exposed electrically conductive surfaces is desirably minimized in target assemblies which are to be used for such materials. One way of such minimization is to move the insulators 73 and 119 of the support assembly 65 and 69, respectively, downward closer to their respective seal housings 91 and 127. By breaking the electrical connection at a lower point, the support structure above the insulator is then held at ground potential and the undesired dielectric deposition does not occur on those surfaces. Another possibility is to substitute a dielectric material, such as a ceramic, for the metal end pieces 71 and 115, but ceramic is often difficult to work.

Another approach is to cover the metallic exposed surfaces of the end blocks 71 and 115, in the arrangement shown in FIG. 2, with ceramic plates at least 0.25 inch thick. Deposition of the dielectric on such insulating plates will then not result in arcing since there is no large voltage surface immediately behind the dielectric layer being formed. Any small gaps that might exist between dielectric plates are covered by positioning a Kapton plastic layer against the metal surface to cover the exposed area. Another technique is to plasma spray an aluminum oxide layer on these exposed surfaces. Another alternative approach, when the end blocks 71 and 115 are made of aluminum material, is to hard anodize the exposed surfaces. The goal of these techniques is to reduce the likelihood of such undesirable dielectric formation.

Build-up on the target surface 61 of the dielectric film being deposited is avoided by its constant removal upon bombardment of the surface positioned in the vicinity of the magnets. Substantially the entire surface is thus bombarded in one revolution of the cylinder 59. The rotating target surface 61 itself tends to be self-cleaning. The use of a rotating cylindrical magnetron for depositing silicon based dielectric films is the subject of U.S. Pat. No. 5,047,131 that issued from copending Wolfe et al U.S. patent application Ser. No. 433,690, entitled "Method for Coating Substrates with, Silicon Based Compounds," filed Nov. 8, 1989, which is incorporated herein by reference.

Referring to FIG. 6, a cross-sectional view of a second embodiment of a rotating cylindrical target structure is shown. This embodiment is similar to that previously described with respect to FIGS. 2-5, but with principal differences in the cylindrical target end support structures and associated cooling, rotating and electrical energization mechanisms. First and second support structures 201 and 203 of FIG. 6 correspond, respectively, to support structures 65 and 69 of the embodiment of FIG. 2. A principal difference is that they are made of metal and both mechanically and electrically connected with the vacuum chamber walls 205. Spindle shafts 207 and 209 correspond, respectively, to spindle shafts 63 and 67 of the embodiment of FIG. 2. A tube 211 extends the length of the cylindrical target and its end spindle shafts and, like its tube 79 counterpart of the embodiment of FIG. 2, is fixed against rotation and provides a coolant path for the cylindrical target structure. A sleeve bearing 212, made of electrically insulating material, holds the spindle shaft 209 and tube 211 separated from each other.

In order to electrically isolate the cylindrical target structure from the vacuum chamber walls 205, its end spindles are carried in the support structures by two vacuum seal housings 215 and 217. A water seal housing 213 is also provided. These three pieces 213, 215 and 217 may be machined from a commercially available poly-ethylene-tere-phthalate, an electrically non-conductive material.

A principal function of the plastic pieces 215 and 217 is to rotatably carry the respective spindle shafts 207 and 209. Appropriate bearing assemblies 219 and 221 are provided in the respective plastic pieces 215 and 217 for this purpose. Another function of these plastic pieces is to provide an air pressure seal between the vacuum within the chamber and atmospheric pressure within their respective support assemblies 201 and 203. In order to accomplish this, appropriate dynamic u-cup rotating seals 223 and 225 are provided. Electrically insulating bearing retainers 224 and 228 are attached, respectively, to the pieces 215 and 217. In order to make sure that the bearings and seals have enough grease for optimum operation, grease supply tubes 227 and 229 are respectively provided for the plastic pieces 215 and 217, communicating with the bearings and seals by respective ducts 231 and 233.

The bearing retainers 224 and 228 are preferably made of a ceramic material and cover the entire face of the plastic pieces 215 and 217, respectively, in order to protect them from the environment of the sputtering chamber that they face. The retaining plates 224 and 228 are extended onto the metal (usually aluminum) portion of the respective support structures 201 and 203, terminating with their outer edges avoiding contact with the metal surfaces by being positioned over respective grooves 226 and 230. This edge termination desirably avoids any metal film deposition on the ceramic plates from extending into contact with the metal.

A primary function of the third plastic part 213 of the embodiment of FIG. 6 is to provide coupling between the interior of the target assembly and cooling liquid supply and exhaust tubes. A sectional view of this piece is provided in FIG. 7. It is anchored to the frame 205 and also provides a means to hold the internal coolant tube 211 from rotation or other movement while making sure it remains insulated from the metallic frame portions. The piece 213 has two liquid chambers 235 and 237 which are separated by a wall 239. The wall 239 contains an opening through which the tube 211 passes, but the outside of the tube is sealed to that opening in the wall 239 so that liquid does not pass between the chambers 235 and 237. A liquid supply tube 241 supplies liquid to the chamber 235 which, in turn, flows into the interior of the tube 211 through appropriate side wall openings. Liquid travels the length of the cylindrical target structure within the tube 211, to escape at openings at an opposite end within the spindle shaft 209. A return path within the spindle shafts and cylindrical target, but outside the tube 211, causes cooling liquid to flow into the chamber 237 of the plastic part 213 and out of an exhaust tube 243.

An opening of the plastic part 213 that receives the spindle shaft 207 is provided with a u-cup rotating seal 245 in order to prevent water from leaking into the interior portion of the support structure 201. A plastic seal retaining plate 246 is attached to the part 213.

Because of the use of these plastic parts to insulate the rotating target assembly immediately adjacent that assembly, thus allowing the support structures 201 and 203 to otherwise be made of grounded metallic material, it is not convenient to provide a mechanism in the support structure 201 to resist the axial thrust of the target assembly caused by the liquid coolant. Rather, in this embodiment, a piece 247 attached to an end of the spindle 209 cooperates with a thrust ball bearing 249. A plastic disk 250 is inlaid into an end wall of the vacuum chamber frame 205. Any axial thrust to the right of the target assembly, in the embodiment of FIG. 6, is thus resisted by the frame structure itself.

In the embodiment of FIG. 6, the cylindrical target structure is rotated by providing a sprocket 251 attached to the spindle 209 and a mating toothed, electrically insulating drive belt 253. Electrical contact is provided by a brush assembly including a plurality of curved brushes 255, 257, etc., which are held against rotation by a part 259 that is prevented from rotating with respect to the frame 205 by a plastic piece 261. An appropriate sleeve 263 is carried by the spindle 209 to provide a surface against which the brushes ride. The potential of the brushes is established through an electrical conductor 265.

Although the various features of the present invention have been described with respect to preferred embodiments thereof, it will be understood that the invention is entitled to protection within the full scope of the appended claims.

We claim:

1. In a magnetron of a type having a target surface formed on an outside of a cylinder that is positioned within walls of a vacuum chamber and which contains a magnet structure within it that extend substantially its full length, a mechanism for supporting, rotating, cooling and energizing the target structure, comprising:

first and second extensions from opposite ends of the target cylinder and rigidly attached thereto, said extensions being cylindrically shaped with axial center lines coincident with that of said target cylinder, means within said target cylinder for restraining said magnet structure from rotating therewith, and wherein said magnet structure includes a plurality of rollers carried thereby and riding on an inside surface of said target cylinder, thereby to maintain separation between said magnetic structure and the inside surface of said target structure, a first support structure attached to said vacuum chamber walls and rotatably carrying said first extension in a manner that restrains movement of thereof in an axial direction, a second support structure attached to said vacuum chamber walls and rotatably carrying said second extension in a manner that allows movement thereof in an axial direction, means provided as part of said first support structure for both supplying and withdrawing cooling fluid from within said target cylinder, means provided as part of either of said first or second support structures for rotating the target cylinder, and means provided as part of said second support structure and including an electrical brush contacting said second target cylinder extension for electrically energizing said target surface.

2. A cylindrical magnetron constructed in a vacuum chamber enclosure, comprising:

at least two cylindrically shaped target structures positioned adjacent each other and rotatable about individual longitudinal axes thereof, and each of said target structures containing an elongated magnetic element positioned therein toward their bottom and which are held non-rotatable therewith, the magnetic element of one of said target structures having poles arranged in north-south-north poles order across a cross-section thereof and the magnetic element of another of said target structures having its poles arranged in a south-north-south order across a cross-section thereof, whereby an extension of a plasma created within the magnetron between the target structures is avoided.

3. A cylindrical magnetron constructed in a vacuum chamber enclosure, comprising:

at least one elongated cylindrically shaped hollow target structure supported within said vacuum chamber in a manner to be rotatable about a longitudinal axis thereof, means operably connected with said target structure for rotating the target structure about its said longitudinal axis, a magnet structure within said target structure that extends substantially its full length and is restrained from rotation therewith, and a plurality of rollers carried by said magnet structure and riding on an inside surface of said target structure, thereby to maintain separation between said magnetic structure and the inside surface of said target structure.

4. The magnetron according to claim 3 which additionally comprises a cooling fluid conduit positioned within said target structure and extending its length, said conduit being restrained against rotation by connection with said chamber enclosure, said magnet structure being restrained from rotating with the target structure by attachment with said conduit.

5. The magnetron according to claim 4 wherein said plurality of rollers are positioned only at a position approximately at a middle of the length of said target structure.

6. In a magnetron of a type having a target surface formed on the outside of a hollow cylinder that is positioned within metallic walls of a vacuum chamber and which contains a magnet structure within it that extends substantially its full length, a mechanism for supporting, rotating, cooling and energizing the target structure, comprising:

first and second metallic extensions from opposite ends of the target cylinder and rigidly attached thereto, said extensions being cylindrically shaped with axial center lines coincident with that of said target cylinder, first and second metallic support structures mechanically and electrically connected with said vacuum chamber walls and spaced apart a distance to carry said first and second target cylinder extensions, respectively, means provided as part of said second support structure for rotating the target cylinder, an elongated hollow tube positioned within the target cylinder along substantially its entire length and extending at least through said first cylindrical extension and out of an open end thereof, said tube having an outside diameter such that a liquid path is provided around an outside surface thereof between an inside surface of said first extension and said target cylinder, a liquid passage being provided adjacent said second cylindrical extension between said liquid path and an interior of said tube, a first non-electrically conductive part carried by said first support structure and including two adjacent liquid chambers separated by a wall having an opening therein, said hollow tube extending through said first chamber and opening into said second chamber by passing through said wall opening with its said outside surface being sealed with said wall, the open end of said first cylindrical extension opening into said first chamber, a liquid supply conduit connected to one of said first and second chambers and a liquid exhaust conduit connected to another of said first and second chambers, thereby to provide a closed fluid path from a liquid supply through the first non-electrically conductive part to within the target cylinder and out again through the first non-electrically conducive part and the exhaust conduit, a second non-electrically conductive part carried by said second support structure and rotatably supporting said second cylindrical extension in a manner to electrically insulate the second cylindrical extension from the second support structure, and means provided as part of said second support structure and including an electrical brush contacting said second cylindrical extension for applying an electrical potential to said target surface with respect to said vacuum chamber metallic walls.

7. The magnetron structure of claim 6 which additionally comprises a third non-electrically conductive part carried by said first support structure and rotatably supporting said first cylindrical extension in a manner to electrically insulate the cylindrical extension from the first support structure, said first non-electrically conductive part being formed to avoid supporting said first cylindrical extension.

8. The magnetron structure of claim 6 which additionally comprises means within said target cylinder for restraining said magnet structure from rotating therewith, and wherein said magnet structure includes a plurality of rollers carried thereby and riding on an inside surface of said target cylinder, thereby to maintain separation between said magnetic structure and the inside surface of said target structure.

9. The magnetron structure of claim 6 which additionally comprises an anode surface held within said vacuum chamber a distance above said target surface inbetween said first and second support structures.

10. The magnetron structure of claim 9 which additionally comprises means provided as part of said anode structure for cooling said anode.

* * * * *